United States Patent [19]

Saffer et al.

[11] Patent Number: 4,922,180

[45] Date of Patent: May 1, 1990

[54] CONTROLLED MICROWAVE SAMPLE IRRADIATION SYSTEM

[75] Inventors: Jeffrey D. Saffer; Louis A. Profenno, both of Ellsworth, Me.

[73] Assignee: The Jackson Laboratory, Bar Harbor, Me.

[21] Appl. No.: 347,066

[22] Filed: May 4, 1989

[51] Int. Cl.$^5$ ........................ G01R 27/04; H03H 5/00

[52] U.S. Cl. ................................ 324/639; 333/24 R; 343/895

[58] Field of Search ..................... 324/58.5 A, 58.5 R, 324/58.5 C; 343/895; 333/24 R; 219/10.55 A

[56] References Cited

U.S. PATENT DOCUMENTS 2,915,715 12/1959 Young, Jr. .......................... 333/202
3,083,364 3/1963 Scheldorf ............................ 343/895

*Primary Examiner*—Reinhard J. Eisenzopf
*Assistant Examiner*—Maura K. Regan
*Attorney, Agent, or Firm*—Daniel H. Kane

[57] ABSTRACT

A microwave antenna structure couples electromagnetic microwave energy from a microwave transmission line into a sample contained in a sample container without invasion of the sample. The microwave antenna structure is formed by a bifilar helix of conducting first and second helical elements. The first and second helical elements are arranged in a parallel relationship defining a double helix with alternating spaced apart helical turns from the respective first and second helical elements. The double helix forms a holder for receiving and holding a sample container within the turns of the double helix. The first and second helical elements are formed with coupling extension for coupling to opposite polarity conductors of a microwave transmission line. Electromagnetic microwave energy propagating along the transmission line is coupled into sample material within the sample container. A multiple sample microwave irradiation system provides an oil bath in the form of a reservoir containing relatively low dielectric constant fluid oil. A temperature regulator and circulator is immersed in the oil bath for uniform temperature control throughout the reservoir. Multiple microwave antenna structures and sample containers are suspended and immersed in the oil bath. Multiple microwave branch transmission lines couple microwave energy into the respective antenna structures.

24 Claims, 2 Drawing Sheets

CONTROLLED MICROWAVE SAMPLE IRRADIATION SYSTEM

The U.S. Government has rights in this invention by reason of research and development support under Department of Defense Office of Naval Research Contract No. N00014-87-K-0145.

TECHNICAL FIELD

This invention relates to antenna structures and transmission line termination structures for delivering and coupling microwave electromagnetic energy into samples. The invention also provides a controlled system for multiple sample irradiation using the sample loaded antenna structures. It is particularly useful for microwave irradiation of biological and biochemical samples.

BACKGROUND ART

Conventional microwave components such as waveguides and resonant cavities can provide only limited coupling of incident microwave energy into samples for irradiation. In the Thibault U.S. Pat. No. 3,599,120 a double ended helix waveguide transmission structure is provided in an effort to achieve more efficient coupling of microwave energy from a resonant cavity into a sample. The spiral helix structure at one end is inserted in the resonant cavity of a microwave energy source to pick up microwave frequency electromagnetic energy. The energy is transmitted along a conductive stem to the second spiral helix structure at the other end of the stem outside the resonant cavity. The second spiral helix structure is immersed in the sample, such as a liquid sample, for radiating energy into the sample. The purpose of the Thibault structure is to excite electron spin resonance in the sample material for microwave spectroscopy measurements on the sample material.

A difficulty in attempting to apply the Thibault structure to irradiation of biological samples is that the integrity of the sample is lost upon immersion or invasion of the spiral helix into the sample. There is no provision for maintaining the integrity of the sample in sealed standard sample tubes. Another disadvantage is that only one sample at a time can be irradiated using the relatively expensive Thibault equipment.

Similarly in the Jean U.S. Pat. No. 4,221,948, microwave antenna structures are embedded in a cylindrical receptacle containing the dielectric material to be treated with microwave energy. The Jean structure is referred to as an "applicator" for treating dielectric materials. Embedded antennas may be cylindrical, slotted, and helical, etc.

Another problem arises in the assessment of effects of microwave energy irradiation on biological and biochemical samples. It is desirable to separate and delineate effects causes by direct absorption of the microwave energy in target tissues and molecules from the indirect effects causes by heating of surrounding water molecules, etc. The Gray U.S. Pat. No. 3,494,723 describes temperature control using a circulating coolant gas in a microwave energy system. However, the Gray system is a heat sterilization or pasteurization system using heat treatment. The coolant system is intended only for controlling the temperature level of treatment and for rapid cooling after treatment. No references of which applicant is aware are specifically directed to the problem of separating and delineating direct microwave energy absorption effects from indirect heating effects.

The general field of microwave radiation contains a substantial literature on microwave antenna structures for transmitting and receiving microwave frequency electromagnetic radiation in space. For example the Cone et.al. U.S. Pat. No. 4,014,028 describes a backfire bifilar helical antenna for radiating and receiving circularly polarized waves in a backfire mode. There is no teaching however how such microwave transmitting and receiving structures might be applied to the field of irradiating biological samples nor is there any suggestion in this general literature of the desirability of doing so. Another problem associated with conventional microwave transmission and receiving antenna structures is that the radiation field may extend into the surrounding environment with unknown effects on workers in the vicinity.

OBJECTS OF THE INVENTION

It is therefore an object of the present invention to provide a new antenna structure and transmission line termination structure for efficiently coupling microwave frequency electromagnetic energy from a microwave transmission line into a sample. A related object of the invention is to focus and confine the radiated microwave energy in the sample material without significant radiation in the environment surrounding the samples.

Another object of the invention is to provide a microwave irradiation system for irradiating biological and biochemical samples without invading the sample. The invention assures the integrity of the samples in sealed standard sample tubes while efficiently coupling microwave energy into the sample material.

A further object of the invention is to provide a microwave irradiation system for simultaneous coupling of microwave energy into multiple samples. At the same time the invention provides a controlled environment and cooling system for controlling the temperature of the multiple irradiated samples. As a result the direct effects of absorption of microwave frequency electromagnetic energy may be separated from indirect heating effects.

DISCLOSURE OF THE INVENTION

In order to accomplish these results the invention provides a new microwave antenna structure for coupling electromagnetic microwave energy from a microwave transmission line into a sample contained in a sample container. In the preferred embodiment, the microwave antenna structure is formed by a bifilar helix of conducting first and second helical elements. The first and second helical elements are arranged in a parallel relationship defining a double helix with alternating spaced apart helical turns from the respective first and second helical elements. The turns of the first and second helical elements turn in the same direction with a substantially constant phase relationship.

According to the invention the double helix forms a holder for receiving and holding a sample container within the turns of the double helix. The first and second helical elements are formed with coupling extensions extending above the double helix holder for coupling to opposite polarity conductors of a microwave transmission line. By this arrangement electromagnetic microwave energy propagating along the transmission line is coupled into sample material within the sample container.

A feature of this microwave transmission line termination antenna structure is that the parallel association of the helical elements confines the microwave radiation effects to the near field associated with the antenna structure. However, the spaced apart relationship and serpentine winding of the helical elements give rise to microwave frequency electric and magnetic field lines that traverse and pass through the sample. The configuration of the helical winding defining the perimeter of a holder for a sample container concentrates and focuses the near field microwave energy within the sample container.

The invention provides a number of advantages in the handling and coupling of microwave frequency electromagnetic energy into biological and biochemical samples. First, the sample may be sealed in a standard sample container and the integrity of the container and sample maintained without invasion during the irradiation period. Thus, the sample container is inserted and held within the antenna structure configured as a holder and the microwave energy is focused and concentrated within the sample container. Second, very little microwave energy is radiated in the environment surrounding the antenna structure assuring a safe environment for workers. At the same time a significantly greater efficiency of energy coupling of microwave energy propagating along the transmission line into the sample is obtained than has heretofore been achieved. For example, the antenna structure according to the invention is capable of coupling 40% of the incident microwave energy from the transmission line into the sample and typically in the range of 10% to 40%.

Third, the microwave transmission line termination antenna structures which also function as sample container holders are particularly suitable for a multiple sample microwave irradiation system for simultaneously irradiating multiple samples. Furthermore the temperature may be controlled according to the invention to separate and delineate the direct effects of microwave radiation absorption from indirect heating effects all as hereafter further described.

Because the radiation field is localized and contained by the antenna, many antenna structures can be placed in close proximity without interference between the antennas. This is important for simultaneous irradiation of multiple samples where the radiation field affecting a particular sample must be known and well characterized. The invention provides excellent control over the level of irradiation of a sample.

The invention also provides a flexible system adaptable to a variety of sample applications. The sample container holder antenna termination structure with concentrated coupling of energy provides a sample loaded antenna structure. In this structure the impedance of the sample can be empirically matched with the impedance of the incident energy for even greater efficiency of energy coupling.

The invention provides a variety of antenna structure configurations. Viewed generally, the invention provides a microwave antenna structure in the form of a bifilar serpentine configuration winding of conducting first and second winding elements. The first and second winding elements are arranged in a parallel relationship with corresponding serpentine configuration portions of the respective first and second elements in side by side but spaced apart relationship. The serpentine configuration portions of the first and second winding elements follow a substantially constant phase relationship.

Broadly stated the bifilar serpentine winding is formed in a configuration which defines a holder for receiving and holding the sample container. The serpentine configuration portions of the first and second winding elements effectively form the perimeter of the holder for receiving and holding the sample container. The first and second winding elements are formed of a conducting material with sufficient rigidity so that the holder is self supporting. The coupling extensions couple the first and second winding elements to opposite polarity conductors of the microwave transmission line. By way of example the serpentine winding portions of the first and second elements may be in the configuration of alternating loops or alternating arcs folded or wrapped around to define the perimeter of the holder.

A variety of antenna structure terminations are also provided. For example the first and second winding elements at the end of the antenna structure away from the microwave transmission line may be open forming an open termination antenna structure. Alternatively, the ends of the respective first and second antenna elements may be coupled through a resistive or reactive load supplementing the sample load in a sample container held within the antenna structure holder. Generally, the physical parameters of the antenna structure are selected to provide a relatively low Q for coupling electromagnetic microwave energy into a sample over a broad frequency band for example in the range of approximately 2-4 gigahertz (GHz).

In the multiple sample microwave irradiation system, the present invention provides an oil bath in the form of a reservoir containing relatively low dielectric constant fluid oil. A temperature regulator is immersed in the oil bath and may include an oil circulating pump, heating element and thermostat for effective and uniform temperature control throughout the reservoir. Multiple microwave antenna structures according to the invention as described above are suspended from above and immersed in the oil bath. The coupling extensions of the antenna structures from the serpentine winding sample container holder portions extending to the microwave transmission lines and are long enough so that the holders and sample containers inserted in the holders are entirely immersed in the oil bath. Multiple microwave transmission lines couple microwave energy into the respective antenna structures from above through the coupling extensions.

Other objects features and advantages of the invention are apparent in the following specification and accompanying drawings.

BRIEF DESCRIPTION OF THE DRAWINGS

FIG. 1A is a side view of a bifilar helix antenna structure according to the invention with open termination while

DESCRIPTION OF PREFERRED EXAMPLE EMBODIMENTS AND BEST MODE OF THE INVENTION

Figure 1A:
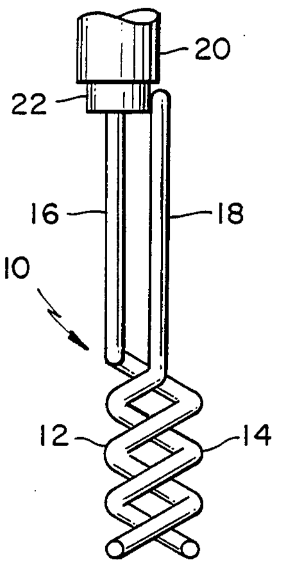
Figure 2:
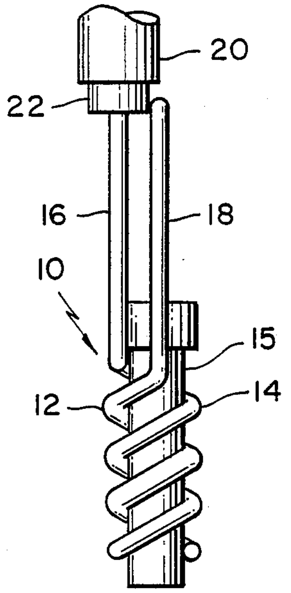
FIG. 2 is a side view of the bifilar helix antenna structure showing the operation of the bifilar helix as a sample container holder.

A double helix antenna structure 10 for coupling microwave frequency energy into samples is illustrated in FIG. 1A. The antenna structure is formed by first and second similar spiral helix elements 12,14. The similar helical turns of the respective antenna elements 12,14 are in parallel and approximately 180° out of phase with a substantially constant phase relationship. As a result, the turns of the respective helices 12,14 alternate along the side of the antenna structure 10. In this example, the turns of the helical elements lie along or define the surface of an imaginary cylinder which provides a holder for receiving a standard sample container 15 as illustrated in FIG. 2.

The parameters of the helical elements 12, 14 are selected to provide a relatively low Q antenna structure for coupling microwave energy over a broad band of microwave frequency for example 2–4 GHz, into a sample contained in the sample container 15. For example, the diameter of the helix is approximately 1 cm and the pitch of each helical element is approximately 2 complete turns per inch (per 2.5 cm). The double helix is approximately one inch long (2.5 cm long) for receiving a standard sample tube 15 with the helical elements 12,14 extending along substantially the entire length of the sample tube.

The helical elements 12,14 are formed from a heavy gauge conductive metal such as copper or copper alloy with sufficient rigidity to be self supporting and to retain the serpentine winding configuration imparted to the helical elements for use as a sample container holder. The helical elements 12,14 are formed with coupling extensions or stems 16,18 of the same heavy gauge rigid conductors for coupling to the conductors of a microwave transmission line 20. In this example, the microwave transmission line 20 is a coaxial cable, for example, 50 coaxial cable. One coupling extension 16 is soldered or otherwise electrically coupled to the center conductor of coaxial line 20, while the other coupling extension 18 is electrically connected to the coaxial sheath 22.

In this example, the coupling extensions 16,18 are approximately 4 cm long and serve to suspend the double helix antenna structure 10 below the end or terminals of the microwave transmission line 20. The length of the coupling extensions or stems 16,18 is sufficient for entirely immersing the antenna structure 10, functioning as a sample container holder, and any sample container 15 in the oil bath reservoir hereafter described. The transmission line 20 remains spaced above the reservoir. The rigid coupling extension conductors 16,18 therefore serve the dual purpose of electrically coupling microwave frequency electromagnetic energy to the antenna structure 10 and mechanically supporting, suspending and spacing the antenna structure 10 below the microwave energy source, in this case coaxial line 20.

Figure 1B:
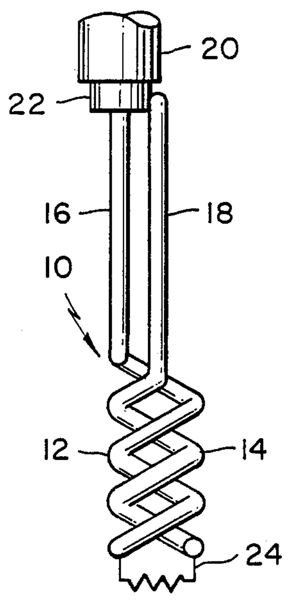
FIG. 1B shows the same antenna structure with a loaded termination.

It is noted in the example of FIGS. 1 & 2 that one of the coupling extensions or stems 18 is slightly longer than the other stem 16. This is because the turns of the helical element are maintained 180° out of phase. The corresponding parallel portions of the turns from the two elements 12,14 are approximately 1 cm apart on opposite sides of the imaginary cylinder surface of the holder defined by the helical elements 12.14. The coupling extensions 16,18 are, however, only approximately 0.5 cm apart, corresponding with the spacing of the conductors in microwave transmission line 20, approximately half the diameter of the line 20. The unequal lengths of the stems 16,18 therefore place the turns of helical elements 12,14 in the desired phase relationship.

The antenna structure 10 functioning as a sample container holder, is generally used with an open termination between the ends of the helical elements 12.14 as illustrated in FIGS. 1A and 2. The antenna structure is therefore "sample Loaded" by the electrical characteristics of the sample in the container 15. In addition, a supplementary resistive or reactive load 24 can be electrically coupled between the ends of the antenna structure elements 12,14 to provide a loaded antenna termination. The parameters of the supplementary load 24 can be selected empirically for matching impedance between the incident microwave and loaded antenna structure for optimum coupling of energy into a sample. For biological samples in a standard sample tube, incident energy applied to the antenna structure may typically be in the range of 10 mW to 1 W.

Figure 3:
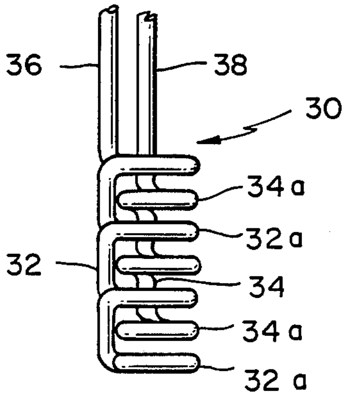
FIG. 3 is a side view of another serpentine winding antenna structure with the first and second winding elements forming alternating loops defining the antenna structure and sample container holder.
Figure 4:
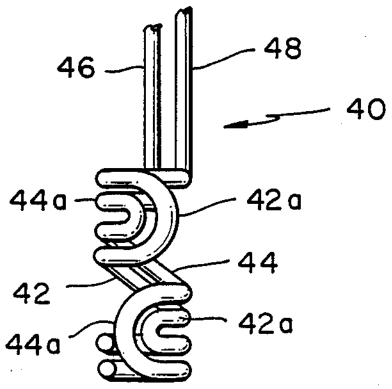
FIG. 4 is a side view of another serpentine winding antenna structure configuration in which the first and second winding elements form alternating arcs that are wrapped around the perimeter of the sample container holder.

Two examples of non-helical but bifilar serpentine winding configuration antenna structures according to the invention are illustrated in FIGS. 3 & 4. In each instance similar non-linear portions of the respective elements are arranged substantially in parallel following a substantially constant phase relationship in the various non-linear turns. This non-linear turning or winding of the respective antenna elements is referred to generally as being "serpentine". The serpentine turns of the respective antenna elements are folded around to coincide with the imaginary surface of a sample container holder. In the preferred examples, the perimeter of the container holder follows the surface of an imaginary cylinder.

In the example of FIG. 3, the antenna structure 30 consists of antenna elements 32 and 34 in parallel relationship. Each of the elements 32,34 is formed with respective turns or loops **32*a*, 34*a* substantially circular and in alternating parallel relationship. The loops at the same time form a sample container holder and an antenna structure that focuses and concentrates microwave energy into a sample. The coupling extensions or stems 36,38 connect the antenna structure to a microwave source such as a microwave transmission line. The stems 36, 38** also serve to suspend the antenna structure as hereafter described.

In the example of FIG. 4, the antenna structure 40 is provided by substantially parallel antenna elements 42 and 44. Each of the elements 42, 44 is formed with respective turns and arcs **42*a*, 44*a* in alternating parallel relationship. The serpentine arcs are folded into the surface defining the sample container holder. The coupling extensions 46, 48** connect the respective antenna elements to the opposite polarity conductors of the microwave transmission line and perform the suspending function.

In forming serpentine configuration antenna structures according to the invention, it is desirable to select serpentine turn configurations that are distributed substantially evenly and uniformly along the imaginary surface defining the sample container holder. This assures a substantially uniform irradiation throughout the volume of the sample. Furthermore the configuration is selected which optimizes power delivery into the sample and absorption by the sample. Generally, a cylindrical configuration imaginary surface with serpentine antenna element winds and turns of circular cross section best focus radiated microwave energy and optimize antenna radiation coupling into the sample. The serpentine configuration antenna elements, spaced apart for radiation into the sample, are therefore wrapped or folded around and along the sample container holder in the preferred configuration of a cylinder for most efficient energy transfer.

The preferred embodiment for these purposes is the double helix bifilar antenna structure of claim 1. Critical parameters of the double helix are the pitch of each antenna element, that is the spacing from one turn to the next, on the same element, and the spacing between the different alternating coils or turns of the two respective antenna elements. These parameters can be determined empirically for optimizing power transfer to particular types of samples. The parameters and dimensions for the helical antenna elements are thus selected to match the operating characteristics and impedance of the antenna structure to the sample. Such determinations are made by measuring incident, reflected and absorbed microwave energy. The example parameter dimensions given above for pitch, spacing, and length were empirically determined to be appropriate for the 10 cm wavelength range, i.e., the 2–4 GHz microwave frequency range. The efficiency of power transfer into a bacterial sample is as great as 40% of the incident microwave energy from the transmission line 20 for incident microwave power in the range of, for example 10 mW to 1 W. The sample is contained in a sealed standard sample tube.

Figure 5:
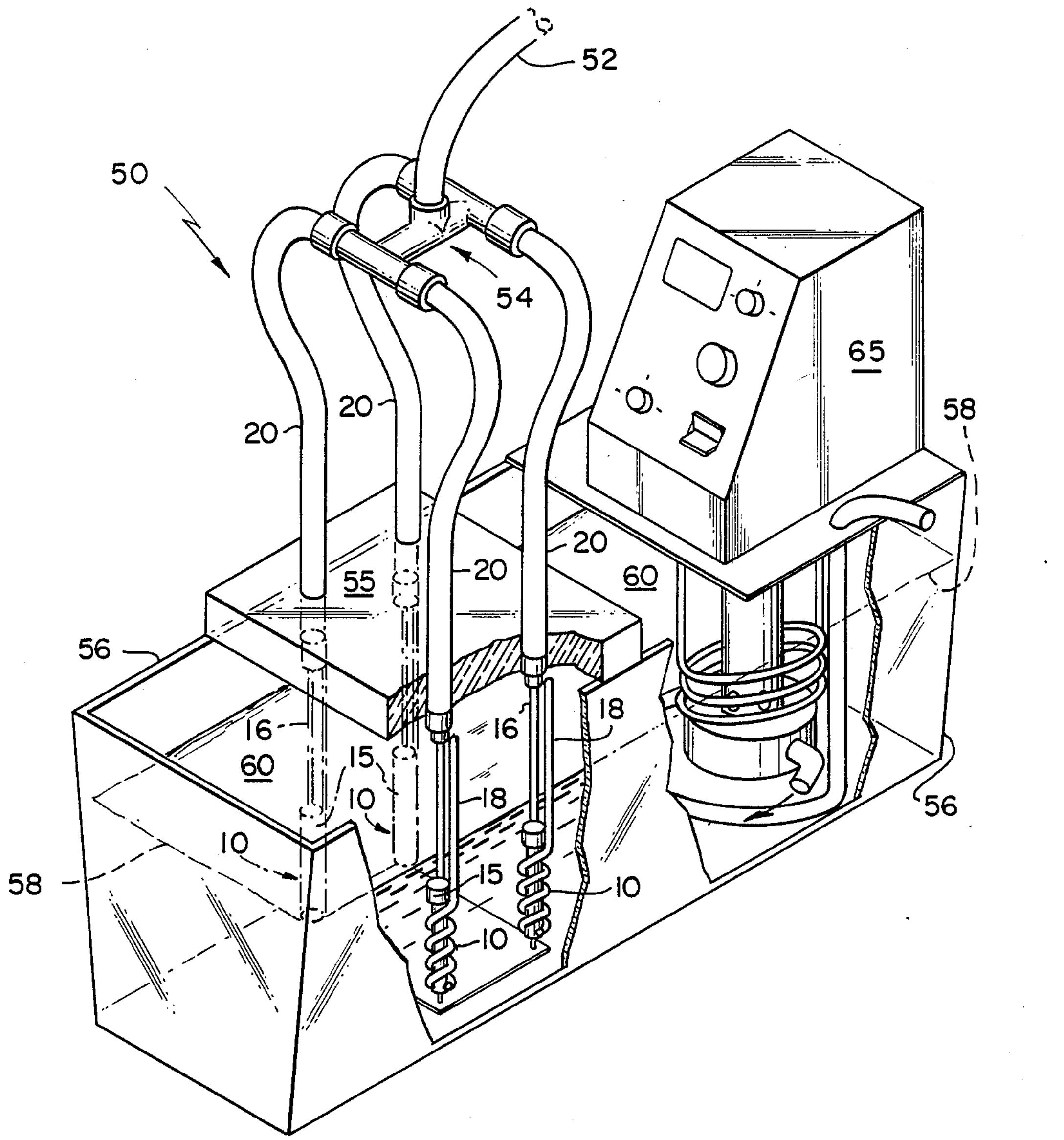
FIG. 5 is a perspective view of the multiple sample microwave irradiation system with the oil bath reservoir partially cut away showing multiple serpentine winding antenna structures functioning as sample container holders with sample containers and samples immersed in the oil bath.

The multiple sample microwave irradiation system 50 is illustrated in FIG. 5. The microwave energy transmission line source 52 is divided at coupler 54 into four branch transmission lines 20, each with a transmission line termination antenna structure 10 of the type illustrated in FIG. 1A. Above the antenna structures 10, the end of each branch transmission line 20 is secured in a mounting plate or block 55. The branch transmission lines 20 are thereby retained in spaced apart vertical axis orientation with the antenna structures 10 suspended below the mounting block 55.

Mounting block 55 rests on the top surface of the oil bath reservoir 56 which is filled to a desired level 58 with transformer oil 60. Transformer oil 60 is selected for the temperature control medium because of its relatively low dielectric constant and low level of absorption and interaction with microwave frequency electromagnetic energy. The dielectric constant for typical TF oil is approximately 4, and the closer to 1 the better is the delineation of direct microwave energy effects in a sample from indirect heating effects. The antenna structures 10 are suspended from the ends of branch transmission lines 20 and mounting block 55 by the extension couplings or stems 16, 18 as heretofore described so that the entire antenna structure 10 and inserted standard sample container tube 15 are entirely immersed in the oil bath below the surface level 58. Such a standard sample tube in which the sample can be sealed is typically approximately 3 cm long and 1 cm in diameter.

Temperature control unit 65 also mounted on the reservoir 56 includes a pump and circulating system for circulation of the ambient temperature control medium 60 throughout the reservoir. A temperature control system and thermostat also regulates the temperature of the circulating oil, either adding or removing heat energy as required to maintain a biologically appropriate temperature for the sample,37° C. Such a temperature control unit is the LAUDA (TM) Constant Temperature Immersion Circulator Model MT. The temperature control oil bath in combination with the microwave energy coupling antenna elements 10 according to the invention minimize indirect heating effects that may be caused by the microwave radiation.

While the invention has been described with reference to particular example embodiments, it is intended to cover all modifications and equivalents within the scope of the following claims.

We claim:

1. A microwave antenna structure for coupling electromagnetic microwave energy from a microwave transmission line into a sample contained in a sample container comprising:

a bifilar helix of conducting first and second helical elements, said first and second helical elements being arranged in parallel relationship defining a double helix with alternating spaced apart helical turns from the respective first and second helical elements, said turns of the first and second helical elements turning in the same direction with a substantially constant phase relationship, said double helix forming a receptacle for receiving and holding a sample container within the turns of the double helix;

coupling means for coupling the first and second helical elements to opposite polarity conductors of a microwave transmission line whereby electromagnetic microwave energy may be coupled into a sample within the sample container;

and a sample container containing a sample for microwave energy irradiation, said sample container being seated in the receptacle formed by the bifilar helix, said winding substantially surrounding the sample containers thereby providing a sample loaded antenna structure termination.

2. The microwave antenna structure of claim 1 wherein the first and second helical elements at the end of the double helix antenna structure away from the microwave transmission line form an open termination antenna structure.

3. The microwave antenna structure of claim 1 further comprising antenna resistor load means coupling the ends of the respective first and second helical elements at the end of the antenna structure away from the microwave transmission line thereby also forming a resistor loaded termination antenna structure.

4. The microwave antenna structure of claim 1 wherein the physical parameters of the double helix are selected so that the impedance of the antenna structure substantially matches the impedance of a sample into which electromagnetic microwave energy is to be coupled.

5. The microwave antenna structure of claim 1 wherein the sample container is in the form of a sample tube seated within the double helix antenna structure.

6. The microwave antenna structure of claim 1 wherein the physical parameters of the double helix are selected to provide a relatively low Q antenna structure for coupling electromagnetic microwave energy into a sample over a broad frequency band in the range of approximately 2–4 gigahertz (ghz).

7. A microwave antenna structure for coupling electromagnetic microwave energy from a microwave transmission line into a sample contained in a sample container comprising:

a bifilar serpentine configuration winding of conducting first and second winding elements, said first and second winding elements being arranged in a substantially parallel relationship with corresponding serpentine configuration portions of the respective first and second elements in side-by-side but spaced apart relationship, said serpentine configuration portions of the first and second winding elements following a substantially constant phase relationship, said bifilar serpentine winding being formed in a configuration which defines a receptacle for receiving and holding a sample container within the serpentine configuration portions of the first and second winding elements;

coupling means for coupling the first and second winding elements to opposite polarity conductors of a microwave transmission line whereby electromagnetic microwave energy may be coupled into a sample in a sample container received within said holder;

and a sample container containing a sample for microwave energy irradiation, said sample container being seated in the receptacle formed by the bifilar serpentine configuration winding, said winding substantially surrounding the sample container thereby providing a sample loaded antenna structure termination.

8. The microwave structure of claim 7 wherein the conducting first and second winding elements comprise helical elements, said first and second helical elements being arranged in an interfitting substantially parallel relationship defining a double helix with alternating spaced apart helical turns from the respective first and second helical elements, said turns of the first and second helical elements turning in the same direction with a substantially constant phase relationship, said double helix defining the receptacle for a sample container.

9. The microwave antenna structure of claim 7 wherein the physical parameters of the bifilar serpentine configuration winding are selected to provide a low Q antenna structure with a broad frequency band for microwave energy coupling in the range of approximately 2–4 ghz.

10. The microwave antenna structure of claim 8 wherein the pitch of the helix of each of the first and second helical elements is at least approximately two turns or cycles per inch (22.5 cm).

11. The microwave antenna structure of claim 7 wherein the physical parameters of the bifilar serpentine configuration winding are selected so that the impedance of the antenna structure is substantially matched with the impedance of a sample and a sample container.

12. The microwave antenna structure of claim 7 wherein the sample container comprises a sample tube and wherein the winding elements of the bifilar serpentine configuration winding conform to an imaginary cylindrical surface thereby forming a cylindrical sample holder.

13. The microwave antenna structure of claim 7 wherein the first and second winding elements are formed in the configuration of alternating loops from the respective first and second winding elements defining the sample container receptacle.

14. The microwave antenna structure of claim 7 wherein the first and second winding elements are formed in the configuration of alternating arcs folded to define the perimeter of the sample container receptacle.

15. The microwave antenna structure of claim 7 wherein the coupling means comprise coupling extension conductors extending above the serpentine configuration portions for spacing the sample container holder from a microwave transmission line.

16. A multiple sample irradiation system for coupling electromagnetic microwave energy from microwave transmission line terminations into multiple samples contained in separate sample containers comprising:

an oil bath comprising a reservoir of relatively low dielectric constant fluid oil;

temperature control means comprising oil temperature regulating means and circulating pump means for circulating the oil;

and a plurality of microwave antenna structures for coupling electromagnetic microwave energy from multiple microwave transmission line terminations into the multiple samples contained in separate sample containers, each microwave antenna structure comprising first and second antenna elements in a configuration defining a holder for receiving and holding a sample container within the first and second antenna elements, and coupling means for coupling the first and second antenna elements to the conductors of opposite polarity of a microwave transmission line whereby electromagnetic microwave energy may be coupled into a sample in a sample container seated in a holder, said plurality of microwave antenna structures being immersed in the oil bath.

17. The system of claim 16 wherein each microwave antenna structure comprises a bifilar helix of conducting first and second helical elements, said first and second helical elements being arranged in a substantially parallel relationship defining a double helix with alternating spaced apart helical turns from the respective first and second helical elements in side by side spaced apart relationship, said turns of the first and second helical elements turning in the same direction with a substantially constant phase relationship, said double helix defining the holder for receiving and holding a sample container within the turns of the double helix.

18. The multiple sample irradiation system of claim 16 further comprising multiple sample containers containing respective samples, said sample containers being seated respectively in said multiple sample container holders formed by the antenna structures and being immersed in the oil bath.

19. The multiple sample irradiation system of claim 16 wherein the low dielectric constant fluid oil comprises transformer oil.

20. The multiple sample irradiation system of claim 18 wherein sample containers comprise standard sample tubes.

21. The system of claim 16 wherein the coupling means comprise relatively rigid conductive coupling extensions, extending from the first and second antenna elements to microwave transmission line terminations for suspending the antenna structures in the oil bath from the coupling extensions.

22. A multiple sample irradiation system for coupling electromagnetic microwave energy from multiple microwave transmission line terminations into multiple samples contained in separate sample containers comprising:

an oil bath comprising a reservoir of relatively low dielectric fluid oil;

temperature control means comprising circulating pump means for circulating the oil and oil temperature regulating means;

and a plurality of microwave antenna structures for coupling electromagnetic microwave energy from the multiple microwave transmission line terminations into multiple samples contained in separate sample containers;

each microwave antenna structure comprising a bifilar serpentine configuration winding of first and second winding elements, said first and second winding elements being arranged in a substantially parallel relationship with corresponding serpentine configuration portions of the respective first and second winding elements being in side-by-side but spaced apart relationship, said serpentine configuration portions following a substantially constant phase relationship, said bifilar serpentine configuration winding defining a holder for receiving and holding a sample container within the serpentine configuration portions of the first and second winding elements, and coupling means coupling the first and second winding elements to opposite polarity conductors of a microwave transmission line termination whereby electromagnetic microwave energy may be coupled into a sample in a sample container seated in a holder;

said plurality of microwave antenna structures being immersed in the oil bath.

23. The multiple sample irradiation system of claim 22 wherein the first and second winding elements of the bifilar serpentine configuration winding for each microwave antenna structure lie in the surface of an imaginary cylinder thereby forming a cylindrical configuration holder.

24. The system of claim 22 wherein the oil comprises transformer oil.

* * * * *